(12) United States Patent
Jang et al.

(10) Patent No.: US 7,273,379 B2
(45) Date of Patent: Sep. 25, 2007

(54) HYBRID CIRCUIT BOARD AND DISPLAY DEVICE HAVING THE SAME

(75) Inventors: Hyeon-Yong Jang, Osan-si (KR); Cheol-Jin Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/248,345

(22) Filed: Oct. 13, 2005

(65) Prior Publication Data

US 2006/0128174 A1 Jun. 15, 2006

(30) Foreign Application Priority Data

Dec. 9, 2004 (KR) .................... 10-2004-0103611

(51) Int. Cl.
*H01R 12/00* (2006.01)
*H05K 1/11* (2006.01)
(52) U.S. Cl. ...................... 439/65; 439/55; 361/803
(58) Field of Classification Search ............... 439/65, 439/55, 68, 74; 361/803, 778, 774
See application file for complete search history.

(56) References Cited

U.S. PATENT DOCUMENTS

| 2,894,241 | A | * | 7/1959 | Mckee | 439/65 |
| 4,513,064 | A | * | 4/1985 | Marcus | 428/582 |
| 5,455,742 | A | * | 10/1995 | Phoy et al. | 361/778 |
| 5,629,839 | A | * | 5/1997 | Woychik | 361/803 |
| 6,496,384 | B1 | * | 12/2002 | Morales et al. | 361/784 |
| 6,775,151 | B2 | * | 8/2004 | Suzuki | 361/788 |
| 2003/0236006 | A1 | * | 12/2003 | Yamashita | 439/65 |

* cited by examiner

*Primary Examiner*—Hien Vu
(74) *Attorney, Agent, or Firm*—Cantor Colburn LLP

(57) ABSTRACT

A hybrid circuit board includes a first circuit board and a second circuit boards. The first circuit board includes a first body having a slot, and a first circuit pattern formed on the first body and extended to the slot. The second circuit board includes a second body, a protruding portion, a second circuit pattern, and a separating member. The protruding portion extends from the second body. The protruding portion is inserted into the slot of the first circuit board to combine the second circuit board to the first circuit board. The second circuit pattern is formed on the second body to be extended to the protruding portion, so that the second circuit pattern is electrically connected to the first circuit pattern of the first circuit board. The separating member is disposed between the second body and the protruding portion to separate the protruding portion from the second body.

4 Claims, 9 Drawing Sheets

US 7,273,379 B2

HYBRID CIRCUIT BOARD AND DISPLAY DEVICE HAVING THE SAME

CROSS-REFERENCE TO RELATED APPLICATION

This application claims priority to and the benefit of Korean Patent Application No. 10-2004-0103611, filed on Dec. 9, 2004, which is hereby incorporated by reference for all purposes as if fully set forth herein.

BACKGROUND OF THE INVENTION

1. Field of the Invention

The present invention relates to a hybrid circuit board and a display device having the hybrid circuit board. More particularly, the present invention relates to a hybrid circuit board including a plurality of functional circuit boards that are combined into one hybrid circuit board and a display device having the hybrid circuit board.

2. Description of the Related Art

A liquid crystal display (LCD) device displays an image based on data provided from an information processing device using light and liquid crystal.

The LCD device includes a liquid crystal control part, a light supply part and a plurality of circuit boards. The liquid crystal control part controls the liquid crystal to display an image. The light supply part supplies a light to the liquid crystal control part. The circuit boards apply a voltage, which is externally supplied, to the liquid crystal control part and the light supply part.

The circuit boards of the LCD device are divided into a circuit board for a liquid crystal control part, which applies a voltage to the liquid crystal control part, and a circuit board for a light supply part, which applies the voltage to the light supply part. Therefore, conventional LCD devices include a number of parts that may be consolidated or combined in order to simplify the assembly process.

SUMMARY OF THE INVENTION

The present invention provides a hybrid circuit board that applies a voltage to a control part and a light supply part through an integrally formed circuit board, and a display device having the hybrid circuit board.

Additional features of the invention will be set forth in the description which follows, and in part will be apparent from the description, or may be learned by practice of the invention.

The present invention discloses a hybrid circuit board, including a first circuit board including a first body, the first body having a slot and a first circuit pattern extending to the slot; and a second circuit board including a second body; a protruding portion extending from the second body, the protruding portion arranged within the slot to attach the second circuit board with the first circuit board; a second circuit pattern formed on the second body that extends to the protruding portion to couple the first circuit pattern with the second circuit pattern; and a separating member provided between the second body and the protruding portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

It should be understood that the exemplary embodiments of the present invention described below may be varied and modified in many different ways without departing from the inventive principles disclosed herein, and the scope of the present invention is therefore not limited to these particular following embodiments. Rather, these embodiments are provided so that this disclosure will be thorough and complete, and will fully convey the concept of the invention to those skilled in the art by way of example and not of limitation.

Hereinafter, the invention is described with reference to the accompanying drawings.

Figure 1:
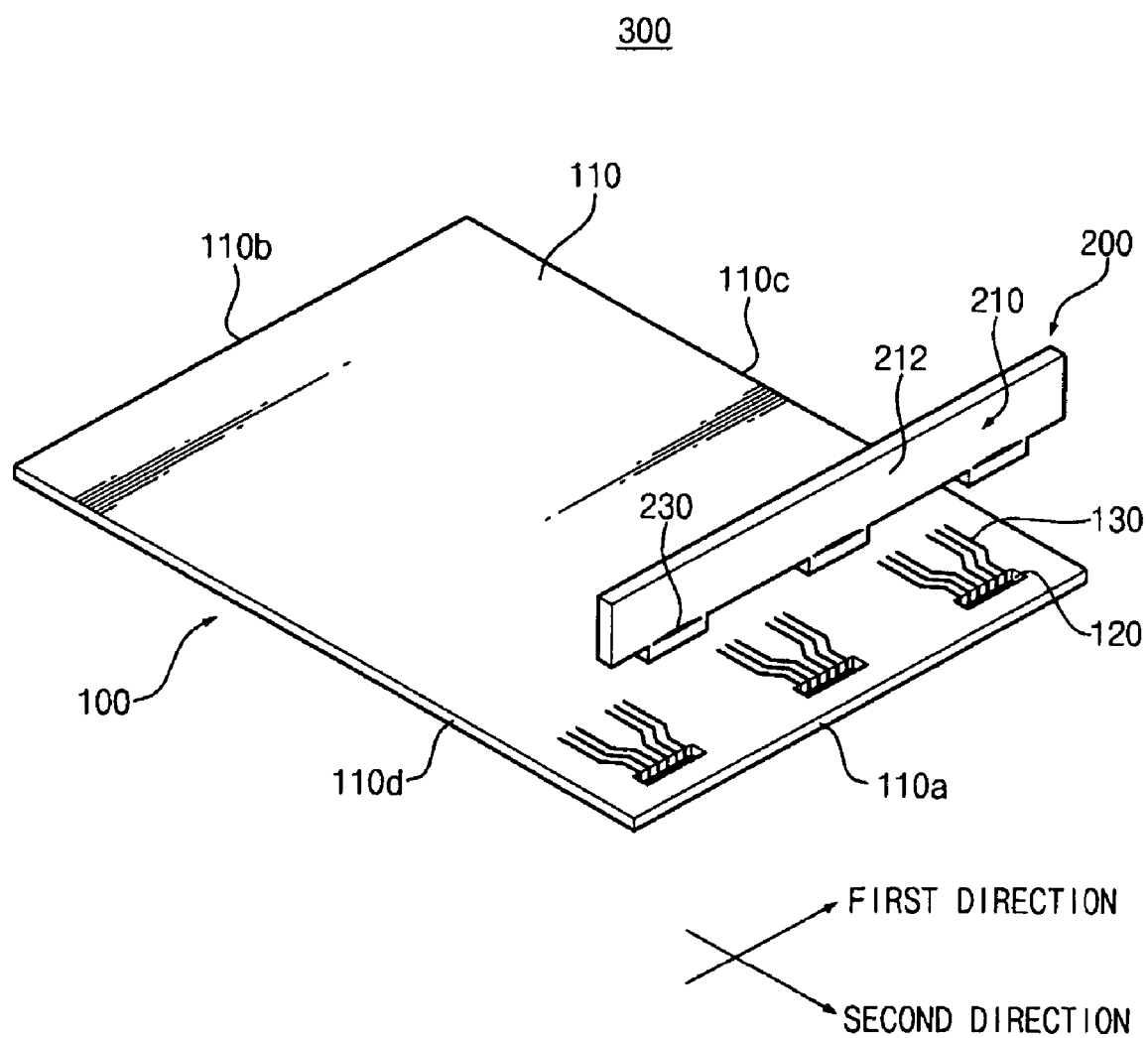
FIG. 1 is an exploded perspective view showing a hybrid circuit board according to an embodiment of the invention.
Figure 2:
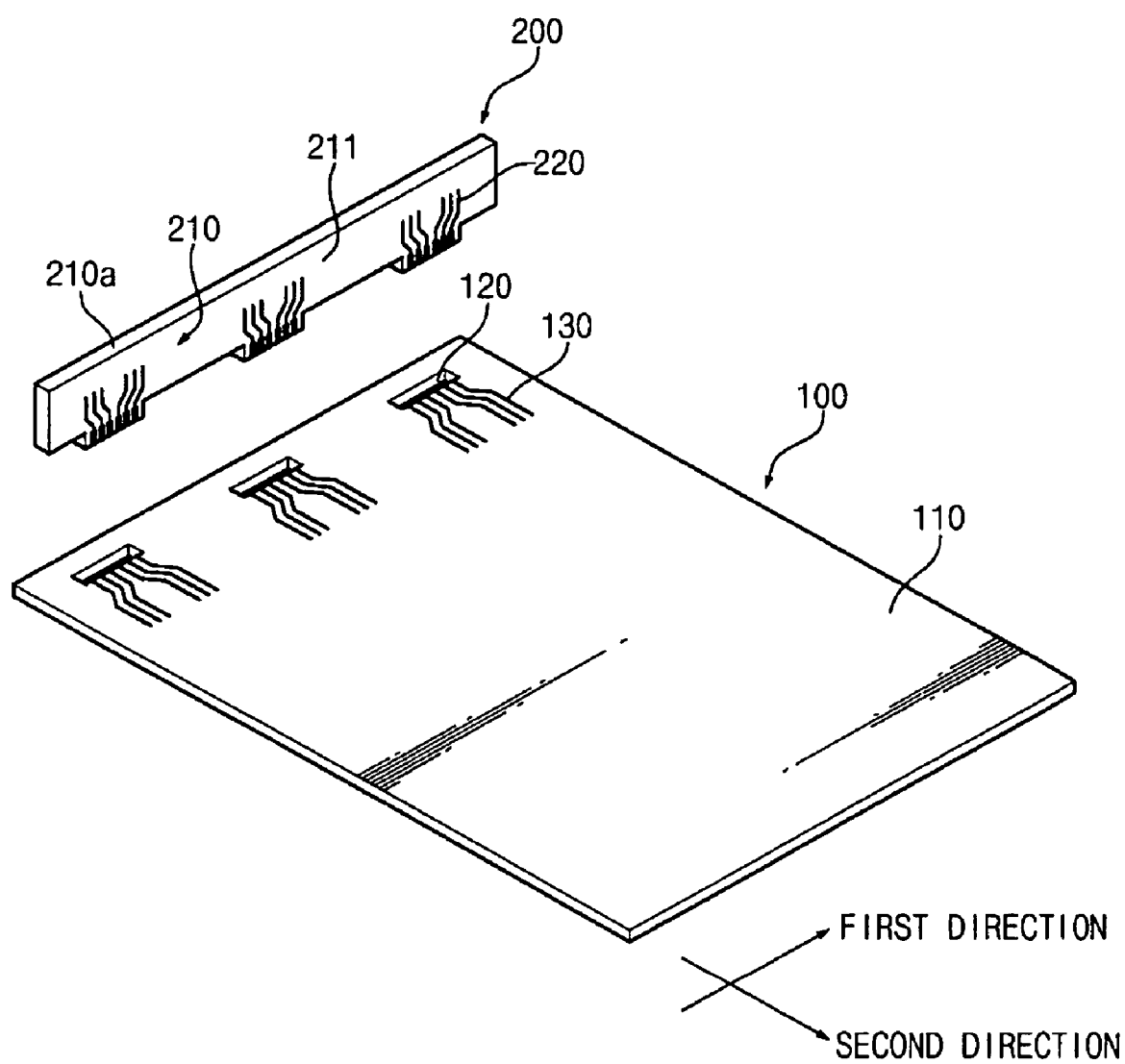
FIG. 2 is another exploded perspective view showing the hybrid circuit board shown in FIG. 1.

FIG. 1 is an exploded perspective view showing a hybrid circuit board according to an embodiment of the invention. FIG. 2 is another exploded perspective view showing a hybrid circuit board shown in FIG. 1.

Referring to FIG. 1 and FIG. 2, the hybrid circuit board 300 includes a first circuit board 100 and a second circuit board 200. The first circuit board 100 applies a power to a control part (not shown) of a display device (not shown). The second circuit board 200 applies a power to a light generating part (not shown).

The first circuit board 100 includes a first body 110, a plurality of slots 120 and a plurality of first circuit patterns 130. Each of the slots 120 and first circuit patterns 130 may be disposed at the first body 110.

The first body 110 may have a substantially rectangular plate-like shape. The first body 110 includes a printed circuit board (PCB). The first body 110 has multiple side surfaces; e.g., a first side surface 110a, a second side surface 110b, a third side surface 110c, and a fourth side surface 110d. As shown in FIG. 1, the first side surface 110a and the second side surface 110b are opposite to each other and substantially parallel to each other. Similarly, the third side surface 100c and the fourth side surface 110d are opposite to each other and substantially parallel to each other.

The first side surface 110a and the second side surface 110b are substantially parallel with a first direction. The third side surface 110c and the fourth surface 110d are substantially parallel with a second direction, the second direction being substantially perpendicular to the first direction.

The slots 120 may be, for example, a hole that is disposed in the first body 110. The slots may have a substantially rectangular-like shape, as shown on a plane view. The slots 120 are arranged along the first direction. Each of the slots has a longitudinal direction that is substantially parallel with the first direction.

The plurality of slots 120, for example, may be arranged in the first body 110 in series. In the present embodiment, three of the slots 120 are shown being aligned in a line along the first direction in the first body 110.

The first circuit pattern 130 is disposed on the first body 110. A portion of the first circuit pattern 130 extends toward an inner side surface area of the first body 110. The inner side surface area of the first body 110 is formed by the slot 120.

Figure 3:
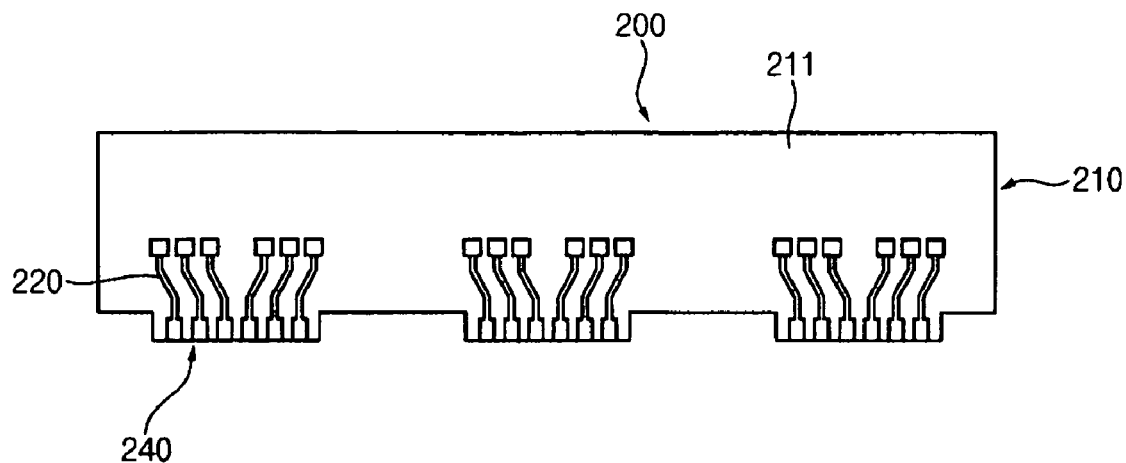
FIG. 3 is a plan view showing a first surface of a second circuit board shown in FIG. 1.
Figure 4:
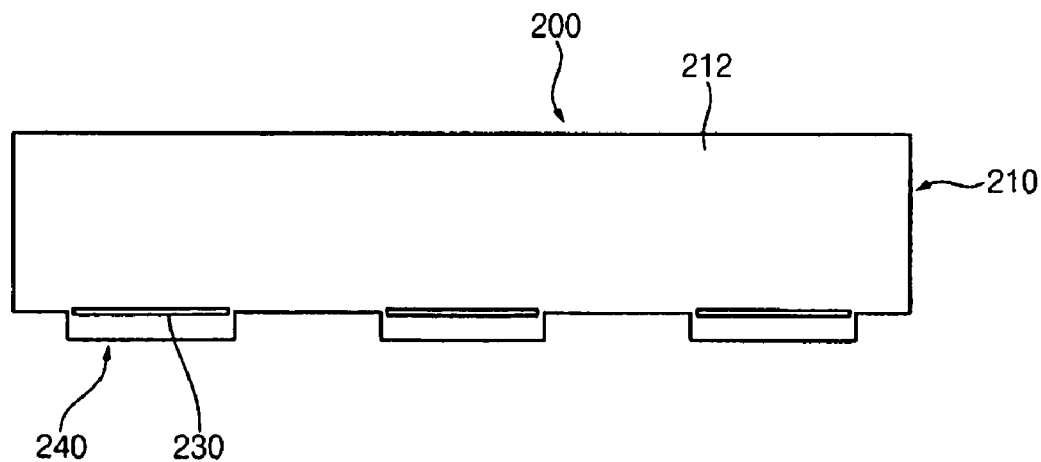
FIG. 4 is a plan view showing a second surface of the second circuit board shown in FIG. 1.

FIG. 3 is a plan view showing a first surface of the second circuit board shown in FIG. 1. FIG. 4 is a plan view showing a second surface of the second circuit board shown in FIG. 1;

Referring to FIGS. 2, 3, and 4, the second circuit board 200 includes a second body 210, a second circuit pattern 220, a plurality of openings 230 and a plurality of protruding portions 240.

The second body 210, for example, may be a substantially rectangular plate-like shape. The second body 210 may include a first surface 211, a second surface 212, and four side surfaces 210a. The second surface 212 is opposite to the first surface 211.

Each of the protruding portions 240 extends from at least one side surface 210a of the second body 210. Alternatively, the protruding portion 240 may be formed by removing a portion of at least one of the side surfaces 210a.

In the present embodiment, the protruding portion 240 extends in a direction that is substantially parallel to the first surface 211 and the second surface 212. Therefore, the protruding portion 240 that is combined or attached with the slot 120 of the first circuit board 100 is substantially perpendicular to the first body 110.

The protruding portion 240 corresponds with the slot 120 so that it may be fit therein. In the present embodiment, the first body 110 includes, for example, three slots 120 and three protruding portions 240 that correspond with the slots 120, respectively, which are formed on at least one of the side surfaces 210a.

The protruding portion 240 has a width corresponding with a width of the slot 120. The protruding portion 240 may extend longer than a thickness of the first circuit board 100.

The second circuit pattern 220 may be formed on both the protruding portion 240 and the second body 210. Thus, when the protruding portion 240 is inserted into the slot 120, the second circuit pattern 220 is electrically connected; e.g., coupled, with the first circuit pattern 130. In addition, the first and second circuit patterns 130 and 220 may be fixed; e.g., soldered, with each other in order to prevent the first circuit pattern 130 and the second circuit pattern 220 from separating.

For example, when the protruding portion 240 of the second circuit board 200 is soldered to the slot 120 of the first circuit board 100, the first circuit board 100 and the second circuit board 200 are difficult to separate from each other. Thus, when the second circuit board 200 needs to be removed or replaced, separating the second circuit board 200 from the first circuit board 100 requires a lot of time and work.

To more easily separate the second circuit board 200 from the first circuit board 100, the second circuit board 200 may include a separating member, e.g., an opening 230. The opening 230 may be a substantially line-like shape that is disposed at a border between the second circuit board 200 and the protruding portion 240. For example, the opening 230 may be formed at a portion where a surface of the first body 110 contacts the second body 210. The opening 230 may be formed in a direction that is substantially parallel to the surface of the first body 110. When the second body 210 and the protruding portion 240 of the second circuit board 200 are firstly separated from each other, and the protruding portion 240 is separated from the slot 120 of the first circuit board 100, the second circuit board 200 and the first circuit board are more easily separated from each other.

The opening 230 may be provided on a portion of the second body 210 that contacts a surface of the first body 110. Preferably, the opening 230 is formed in a direction that is substantially parallel to the surface of the first body 110. When an external force is applied to the second body 210, e.g., a pulling force, the second body 210 and the protruding portion 240 are easily separated.

In the present embodiment, in order for the protruding portion 240 to be easily separable from the second body 210, the second circuit board 200 includes the opening portion 230. Alternatively, the second circuit board 200 may include the separating member, such as a groove, as shown below.

Figure 5:
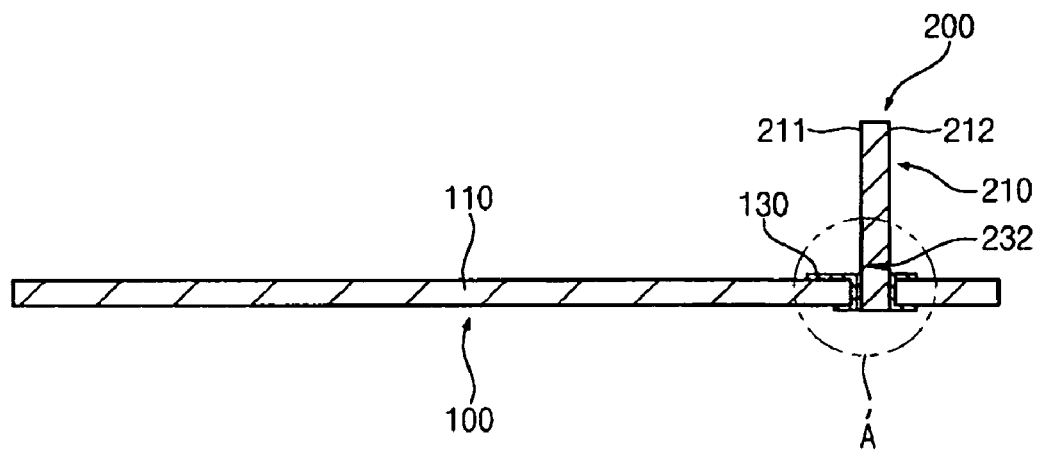
FIG. 5 is a cross-sectional view of a hybrid circuit board according to another embodiment of the invention.
Figure 6:
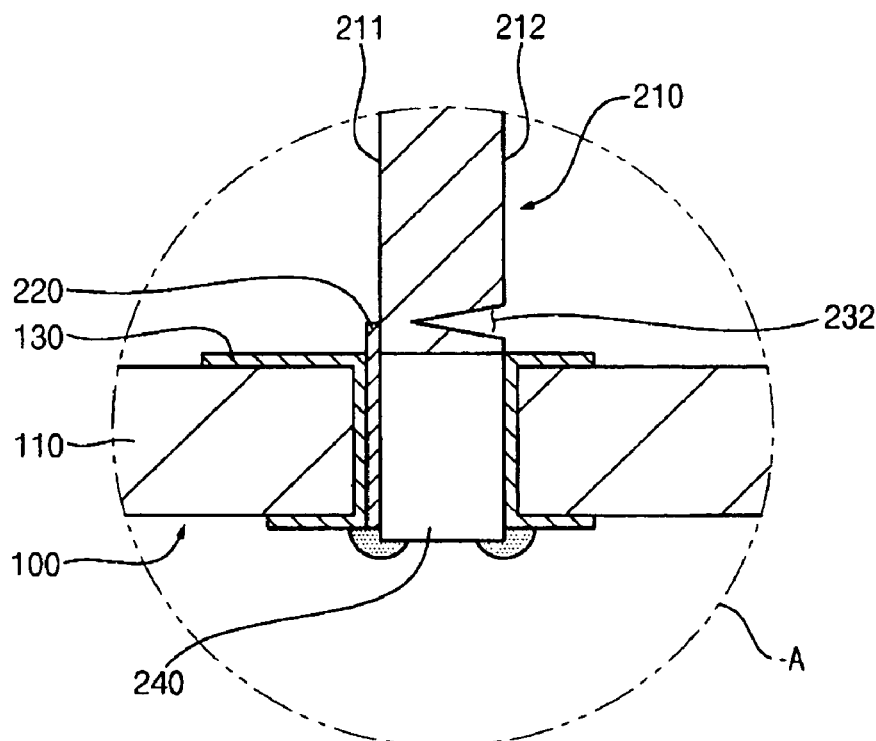
FIG. 6 is an enlarged view showing a portion 'A' shown in FIG. 5.

FIG. 5 is a cross-sectional view showing a hybrid circuit board according to another embodiment of the invention. FIG. 6 is an enlarged view of part 'A' shown in FIG. 5. In the present embodiment, the hybrid circuit board shown in FIG. 5 and FIG. 6 is the same as shown in FIGS. 1, 2, 3, and 4 except for a separating member. Thus, the same reference numerals are used to refer to the same or like parts as those described in FIGS. 1, 2, 3, and 4 and any further explanation is omitted as necessary.

Referring to FIG. 5 and FIG. 6, a second circuit board 200 may include a separating member, such as a groove 232, a notch, or a cut out portion. The groove 232 may have a substantially V-shape. The groove 232 may be provided on a second surface 212 of a second body 210. Preferably, the groove 232 may be formed near a protruding portion 240. The groove 232 extends along a substantially longitudinal direction of the second body 210. The groove 232 may be disposed at a border between the protruding portion 240 and the second body 210 or a region that is adjacent to the border.

In the present embodiment, the separating member corresponds to the groove 232. Therefore, when an external force is applied to the second circuit board 200, the second body 210 easily separates from the protruding portion 240 that is combined with the first circuit board 100. Then, the protruding portion 240 separates from the slot 120 of the first body 110. Therefore, the second circuit board 200 may be easily separated from the first circuit board 100. A cross-section of an inner side surface of the groove 232 has, for example, a substantially V-shape. Alternatively, the cross-section of the inner side surface of the groove 232 may have a substantially U-shape or another shape.

Figure 7:
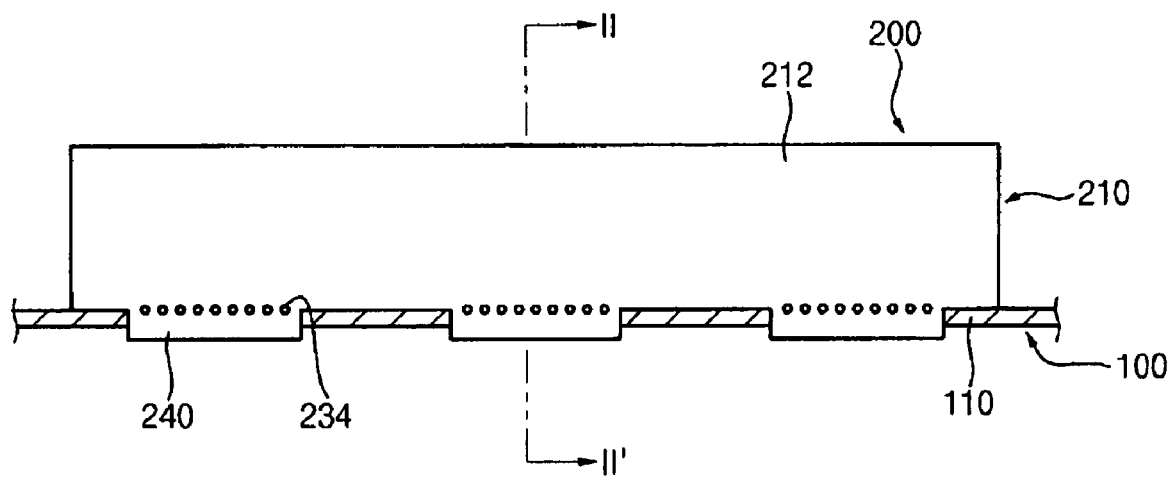
FIG. 7 is a cross-sectional view showing a hybrid circuit board in according to another embodiment of the invention.
Figure 8:
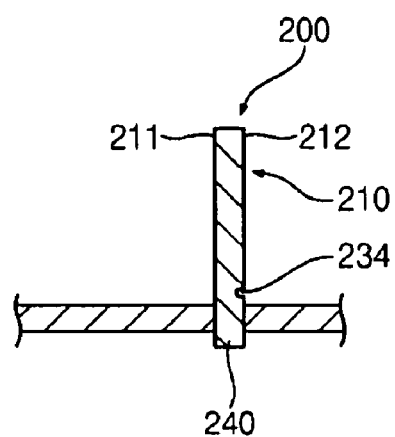
FIG. 8 is a cross-sectional view taken along a line II-II' shown in FIG. 7.

FIG. 7 is a cross-sectional view of a hybrid circuit board in accordance with another embodiment of the invention. FIG. 8 is a cross-sectional view taken along a line II-II' shown in FIG. 7. In the present embodiment, the hybrid circuit board shown in FIG. 7 and FIG. 8 are the same as shown in FIGS. 1, 2, 3, and 4, except for the separating member. Thus, the same reference numerals are used to refer to the same or like parts as those described in FIG. 1, 2, 3, and 4 and any further explanation is omitted as necessary.

Referring to FIG. 7 and FIG. 8, a second circuit board 200 according to an embodiment of the invention may include a separating member such as a plurality of recesses 234 or holes. For example, the recesses 234 may be provided on a second surface 212 of a second body 210. Preferably, the recesses 234 may be provided near a protruding portion 240. The recesses 234 may be arranged along a line that extends along a longitudinal direction of the second body 210. The recesses 234 may be disposed at a border area that is between the second body 210 and the protruding portion 240.

The separating member 234 may correspond to a plurality of recesses arranged along the longitudinal direction of the second body 210, as shown in FIG. 7. The recesses 234, in a plane view, may have a substantially round shape, e.g., an elliptical shape, a rectangular shape, a circular shape, and other similar shapes, etc. The recesses may penetrate or be formed in the second body 210 to form a plurality of holes.

According to an embodiment of the invention, more than one of the recesses 234 are formed on the second surface. The recesses 234 may be arranged along a line that is substantially parallel to a surface of a first body 110. In the present embodiment, a depth of the recess 234 is, for example, less than a thickness of the second body 210.

Figure 9:
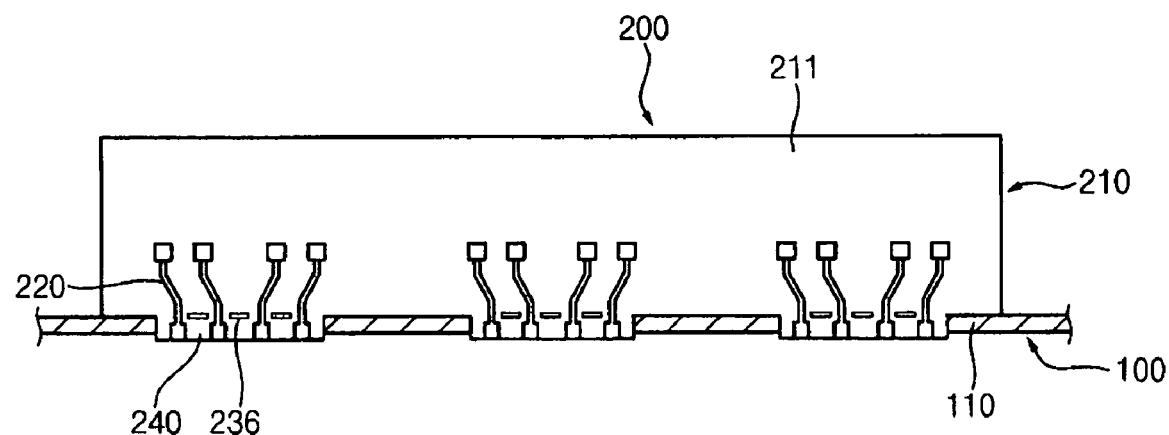
FIG. 9 is a cross-sectional view showing a hybrid circuit board according to another embodiment of the invention.

FIG. 9 is a cross-sectional view illustrating a hybrid circuit board according to another embodiment of the invention. The hybrid circuit board shown in FIG. 9 is substantially the same as shown in FIGS. 1, 2, 3, and 4 except for the separating member. Thus, the same reference numerals are used to refer to the same or similar parts as those described in FIGS. 1, 2, 3, and 4 and any further explanation is omitted as necessary.

Referring to FIG. 9, according to an embodiment of the invention, a second circuit board 200 may include a separating member, such as a plurality of openings 236. The openings 236 may be provided at a first surface 211 of a second body 210. The openings 236 enable the second body 210 to be separated from a plurality of protruding portions 240 that are attached with a first body 110.

A plurality of second circuit patterns 220 are provided on the first surface 211 of the second body 210, therefore, the openings 236 may be formed at any region of the first surface 211 except for the second circuit pattern 220.

To prevent the openings 236 from being overlapped with the second circuit patterns 220, each of the openings 236, when viewed on a plane, is provided on both sides of each of the second circuit patterns 220. Preferably, the opening 236 is formed on a portion where the second body 210 contacts the first body 110. Thus, according to the present embodiment, the opening 236 is preferably a groove having a substantially rectangular like shape.

In the present embodiment, the opening 236 may penetrate the second body 210. Alternatively, the separating member may be a groove having a substantially identical shape as the opening 236. The grooves may have a depth of about half of the thickness of the second body 210.

Figure 10:
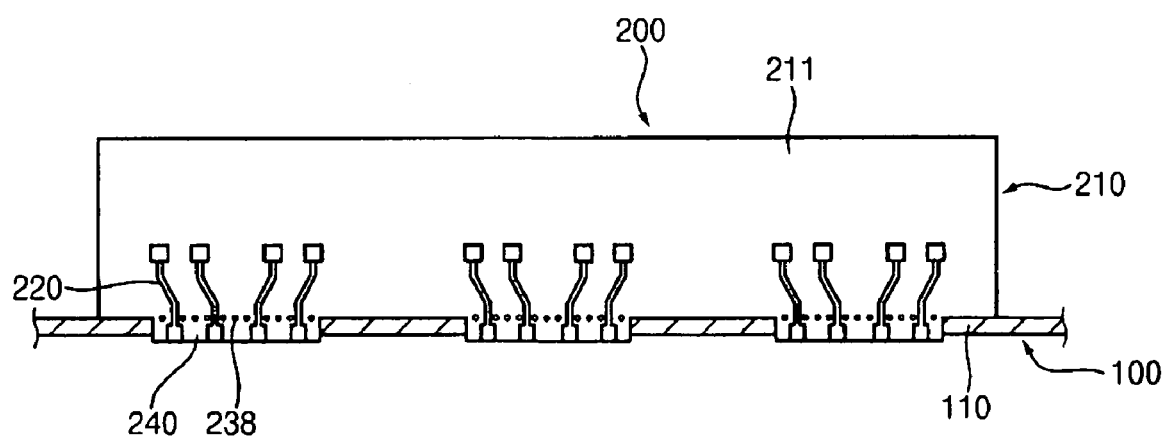
FIG. 10 is a cross-sectional view showing a hybrid circuit board according to another embodiment of the invention.

FIG. 10 is a cross-sectional view of a hybrid circuit board according to another embodiment of the invention. In the present embodiment, the hybrid circuit board shown in FIG. 10 is the same as the hybrid circuit board shown in FIGS. 1, 2, 3, and 4 except for the separating member. The same reference numerals will be used to refer to the same or like parts as those described in FIGS. 1, 2, 3, and 4 and any further explanation is omitted as necessary.

Referring to FIG. 10, a second circuit board 200 may include a separating member, such as a plurality of recesses 238. The recesses 238 may be formed on a first surface 211 of a second body 210. The second body 210 may be easily separated from the protruding portions 240 that are attached with a first body 110 due to the recesses 238.

A plurality of second circuit patterns 220 are provided on the first surface 211 of the second body 210, therefore, the recesses 238 may be formed on any portion of the first surface 211 except for the second circuit patterns 220.

To prevent the recesses 238 from being overlapped with the second circuit patterns 220, the openings 238 are provided on both sides of the second circuit patterns 220. The recesses 238 are preferably formed on a portion where the second body 210 contacts the first body 110.

In the present embodiment, a plurality of the recesses may be arranged along a line on both sides of each of the second circuit patterns 220, respectively. As shown in FIG. 10, for example, three of the recesses 238 may be formed on both sides of each of the second circuit patterns 220, respectively.

The recesses 238 may have a substantially round-like shape; e.g., a circular like shape, an elliptical like shape, a rectangular like shape, or the like.

The recesses 238 are preferably less deep than a thickness of the second body 210. For example, the depth of the recesses 238 is preferably about half of the thickness of the second body 210. Alternatively, the recesses 238 may have the same depth as the thickness of the second body 210. When the depth of the recesses 238 is the same as the thickness of the second body 210, the recesses 238 penetrate the second body 210.

Figure 11:
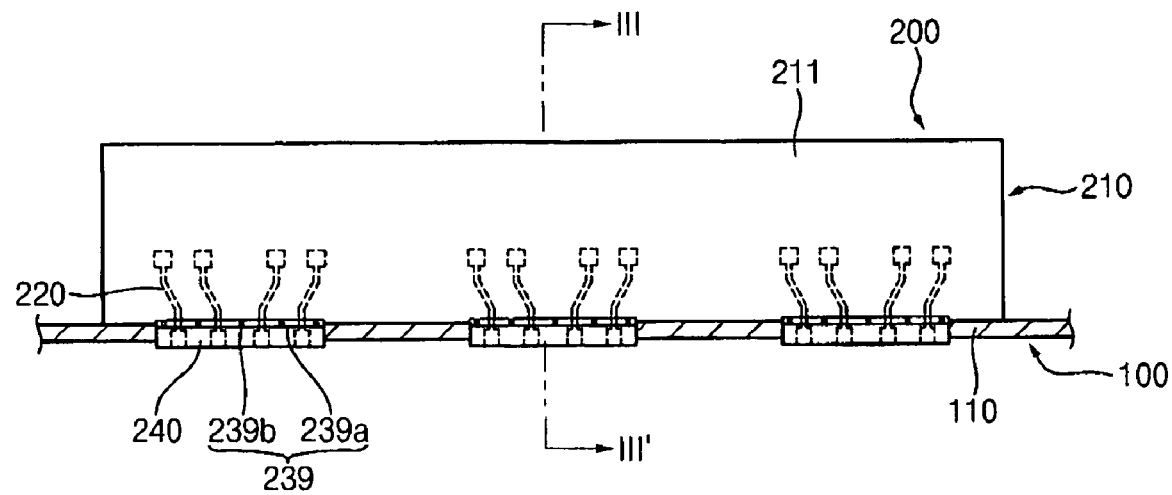
FIG. 11 is a cross-sectional view showing a hybrid circuit board according to another embodiment of the invention.
Figure 12:
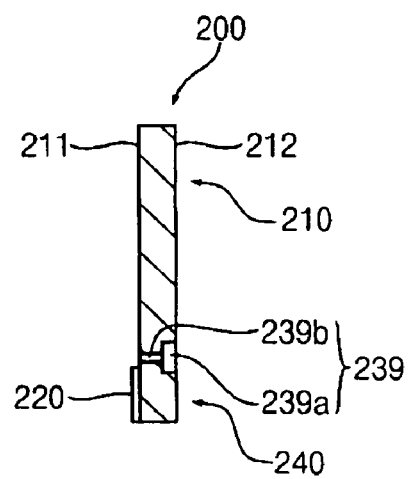
FIG. 12 is a cross-sectional view taken along a line III-III' shown in FIG. 11.

FIG. 11 is a cross-sectional view of a hybrid circuit board according to an embodiment of the invention. FIG. 12 is a cross-sectional view taken along a line III-III' shown in FIG. 11. The hybrid circuit board shown in FIGS. 11 and 12 is the same as shown in FIGS. 1, 2, 3, and 4 except for the separating member. The same reference numerals are used to refer to the same or similar parts as those described in FIGS. 1, 2, 3, and 4 and any further explanation is omitted as necessary.

Referring to FIG. 11 and FIG. 12, a second circuit board 200 may include a separating member, such as a plurality of openings 239. The openings 239 may be provided on a second surface 212 of a second body 210. The openings 239 may be formed on a portion of the second body 210 where the second body 210 contacts a first body 110. The openings 239 may be provided on the second surface 212 along a direction that is substantially parallel to a surface of the first body 110.

The openings 239 may include grooves 239a and through holes 239b. The grooves 239a are provided on the second surface 212 in a direction that is substantially parallel to the surface of the first body 110. Each of the grooves 239a may have a substantially rectangular like shape. An inner side surface of the groove 239a may be a substantially V shape or a substantially U shape. A depth of the groove 239a is less than a thickness of the second body 210.

The through holes 239b may be provided on a bottom surface of the groove 239. At least one of the through holes 239b may be formed along the groove 239. According to the present embodiment, a plurality of the through holes 239b are formed along the groove 239. Each position of the through holes 239b may not overlap with the second circuit pattern 220 that is on the first surface 211 of the second body 210. The through holes 239b are preferably formed on both sides of each of the second circuit patterns 220.

Figure 13:
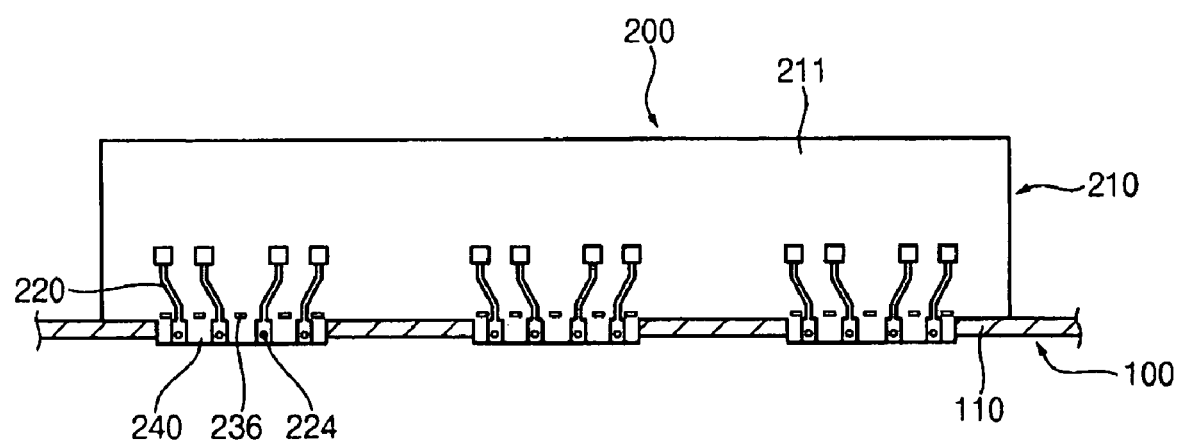
FIG. 13 is a cross-sectional view of a hybrid circuit board according to another embodiment of the invention.

FIG. 13 is a cross-sectional view of a hybrid circuit board according to another embodiment of the invention. In the present embodiment, the hybrid circuit board shown in FIG. 13 is the same as the hybrid circuit board shown in FIGS. 1, 2, 3, and 4 except for the separating member and a connection hole provided at the second circuit pattern. The same reference numerals are used to refer to the same or similar parts as those described in FIGS. 1, 2, 3, and 4 and any further explanation is omitted as necessary.

Referring to FIG. 13, a second circuit board 200 may include a separating member, such as a plurality of openings 236. The openings 236 may be formed on a first surface 211 of a second body 210 to separate the second body 210 from a plurality of protruding portions 240 that is attached with a first body 110.

A plurality of second circuit patterns 220 are formed on the first surface 211 of the second body 210 so that the openings 236 may be formed on any portion of the first surface 211 except for a region corresponding to the second circuit patterns 220.

To prevent the openings 236 from being formed at the second circuit patterns 220, the openings 236 are provided on both sides of each of the second circuit patterns 220. The opening 236 are preferably provided on a portion of the second body 210 where the second body 210 contacts the first body 110. In the present embodiment, the opening 236 is preferably a groove having a substantially rectangular-like shape.

The opening 236 preferably has a depth that is less than a thickness of the second body 210. The depth of the opening 236, for example, may preferably be about half of the thickness of the second body 210.

In addition, a connection hole 224 may be formed on a portion of the first surface 211 of the second body 210 where the second circuit pattern 220 contacts a first circuit pattern (not shown). The first circuit pattern is electrically connected, e.g. coupled, with the second circuit pattern 220, for example, by soldering the connection hole 224 so that the first circuit pattern and the second circuit pattern 220 are firmly fixed with each other.

Figure 14:
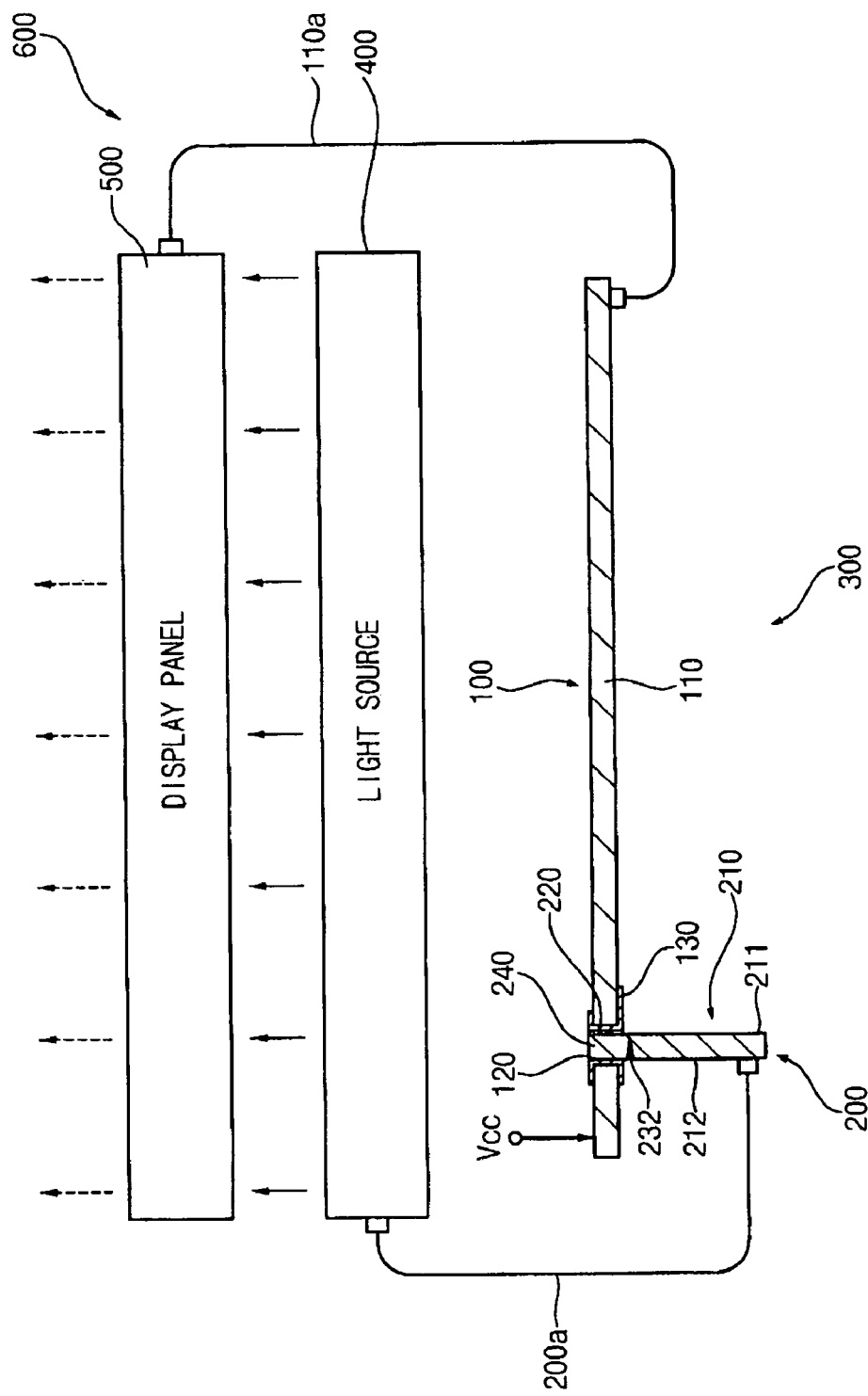
FIG. 14 is a block diagram of a display device according to another embodiment of the invention.

FIG. 14 is a block diagram showing a display device according to another embodiment of the invention. Referring to FIG. 14, the display device 600 includes a hybrid circuit board 300, a light source 400, and a display panel 500.

The hybrid circuit board 300 includes a first circuit board 100 and a second circuit board 200. The first circuit board 100 applies a voltage Vcc, e.g., the voltage may be supplied from an exterior of the display device 600, to the display panel 500. The second circuit board 200 applies the voltage Vcc to the light source 400.

The first circuit board 100 includes a first body 110, a plurality of slots 120 and a first circuit pattern 130. The slot 120 is in the first body 110. The first circuit pattern 130 is on the first body 110.

The first body 110 may be a substantially rectangular plate like shape. The first body 110 may be, for example, a printed circuit board (PCB), which includes four side surfaces.

The slots 120 may be holes provided is in the first body 110. The slots 120 may have a substantially rectangular like shape. For example, the slots 120 may be arranged at the first body 110 along a line. As shown in the present embodiment, three slots 120 are arranged in the first body 110 in series.

The first circuit pattern 130 may be provided on the first body 110. A portion of the first circuit pattern 130 extends to an inner surface of the first body 110. The inner surface of the first body 110 is formed having the slots 120.

The second circuit board 200 may include a second body 210, a second circuit pattern 220, an opening 232, and a protruding portion 240. According to the present embodiment of the invention, the second circuit board 200 may be an inverter that operates the light source 400.

The second body 210 may have a substantially rectangular like shape. For example, the second body 210 may include a first surface 211, a second surface 212 that is opposite to the first surface 211, and four side surfaces. It is understood that the second body may have various shapes other than the shapes discussed above.

The protruding portion 240 extends from at least one of the side surfaces of the second body 210. Alternatively, the protruding portion 240 may be formed by partially removing a portion of one of the side surfaces.

In the present embodiment, the protruding portion 240 extends in a direction that is substantially parallel to the first surface 211 and the second surfaces 212 of the second body 210. Therefore, the protruding portion 240 that is combined, e.g., attached, with the slot 120 of the first circuit board 100 is substantially perpendicular to the first body 110.

The protruding portion 240 is shaped to correspond to the slot 120. Preferably, three slots 120 are provided in the first body 110 and three protruding portions 240 are provided on at least one side surface of the second body.

The protruding portion 240 has a width corresponding to a width of the slot 120. The protruding portion 240 may be longer than a thickness of the first circuit board 100.

The second circuit pattern 220 is provided on the protruding portion 240 and the second body 210. Thus, when the protruding portion 240 is inserted into the slot 120, the second circuit pattern 220 and the first circuit pattern 130 are electrically connected, e.g., coupled, with each other. In addition, the first circuit pattern 130 and the second circuit pattern 220 are soldered or joined to each other to prevent the first circuit pattern 130 and the second circuit pattern 220 from separating from each other.

When the protruding portion 240 of the second circuit board 200 is soldered to; e.g., joined with, the slot 120 provided in the first circuit board 100, the first circuit board 100 and the second circuit board 200 may not be separated from each other. To separate the second circuit board 200 from the first circuit board 100, the second body 210 and the protruding portion 240 of the second circuit board 200 are first separated from the first circuit board 100, and then the protruding portion 240 is separated from the slot 120.

For example, in order to separate the protruding portion 240 from the second body 210, the opening 232 may be formed on the second surface 212 of the second body 210.

In the present embodiment, the opening 232 may be formed on a portion where a surface of the first body 110 contacts the second body 210. The opening 232 is preferably formed along a direction that is substantially parallel to the surface of the first body 110.

The opening 232 may be a groove in order to cause the fatigue failure of the second body 210. In the present embodiment, the second circuit pattern 220 is provided on the first surface of the second body 210. Therefore, the opening 232 being the groove is preferably provided on the second surface 212 of the second body 210.

Alternatively, the opening 232 may be a recess shape. Alternatively, the opening 232 may be provided on the first surface 211 of the second body 210. According to the present embodiment, when the opening 232 is provided on the first surface 211 of the second body 210, the opening 232 is preferably provided on both sides of each of the second circuit patterns 220. Alternatively, the opening 232 may include a groove and a through hole that is formed on a bottom surface of the groove.

The first body 110 of the hybrid circuit board 300 may generate a first driving signal to operate the display panel 500. The first driving signal is applied to the display panel 500 through a first signal line 110a.

The second body 210 of the hybrid circuit board 300 may generate a second driving signal to operate the light source 400. The second driving signal is applied to the light source 400 through a second signal line 200a.

In the present embodiment, the LCD panel 500 includes liquid crystal (not shown), a first substrate (not shown) and a second substrate (not shown). An alignment of the liquid crystal charges in response to an electric field generated by the first substrate and the second substrates.

The first substrate may include, for example, a plurality of pixel electrodes (not shown). The second substrate may include, for example, a common electrode (not shown) that is opposite to the pixel electrodes.

The first substrate preferably includes a thin film transistor (not shown). The thin film transistor is connected, e.g., coupled, with each of the pixel electrodes in order to apply the driving signal to the pixel electrode. The second substrate may include a color filter (not shown) that is opposite to the pixel electrodes. The liquid crystal is provided between the first substrate and the second substrate.

The light source 400 is preferably a cold cathode fluorescent lamp (CCFL). Alternatively, the light source 500 may be light emitting diodes (LED).

According to at least the embodiments of the invention discussed above, when either one of the circuit boards forming the hybrid circuit board is damaged, the circuit board may be easily separated from the other circuit board and replaced. It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A hybrid circuit board comprising:
   a first circuit board comprising a first body, the first body having a plurality of slots and a plurality of first circuit patterns extending into the slots; and
   a second circuit board comprising:
   a second body;
   a plurality of protruding portions each of the protruding portions extending outwardly from the second body, the protruding portions arranged within the slots to attach to the second circuit board with the first circuit board;
   second circuit patterns formed on the second body that extend to the protruding portions to couple the first circuit patterns with second circuit patterns; and
   a separating member provided between the second body and each of the protruding portions,
   wherein the separating member is an elongated opening extending laterally from substantially one side edge to an opposite side edge of each of the protruding portions.

2. The hybrid circuit board of claim 1, wherein the second body and the protruding portion are substantially perpendicular to the first circuit board.

3. The hybrid circuit board of claim 1, wherein the second body comprises a first surface and a second surface that is opposite to the first surface, the second circuit pattern being provided on the first surface and the separating member being provided on the second surface.

4. The hybrid circuit board of claim 1, wherein the second body comprises a first surface and a second surface that is opposite to the first surface, the separating member including a cut-away portion on at least one of the first and second surface.

* * * * *